United States Patent
Lee

(10) Patent No.: US 8,975,650 B2
(45) Date of Patent: Mar. 10, 2015

(54) SEMICONDUCTOR LIGHT EMITTING DEVICE INCLUDING A VERTICALLY ARRANGED LIGHT TRANSMITTING LAYER AND LIGHT EMITTING STRUCTURE

(75) Inventor: Sang Youl Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/563,328

(22) Filed: Jul. 31, 2012

(65) Prior Publication Data

US 2012/0292653 A1 Nov. 22, 2012

Related U.S. Application Data

(63) Continuation of application No. 12/275,072, filed on Nov. 20, 2008, now Pat. No. 8,253,152.

(30) Foreign Application Priority Data

Nov. 23, 2007 (KR) ........................ 10-2007-0119967

(51) Int. Cl.
| | | |
|---|---|---|
| H01L 33/00 | (2010.01) | |
| H01L 33/40 | (2010.01) | |
| H01L 33/38 | (2010.01) | |
| H01L 33/32 | (2010.01) | |

(52) U.S. Cl.
CPC .............. *H01L 33/405* (2013.01); *H01L 33/38* (2013.01); *H01L 33/0079* (2013.01); *H01L 33/32* (2013.01)
USPC 257/98; 257/79; 257/E33.065; 257/E33.068; 257/E33.069

(58) Field of Classification Search
USPC ........ 257/79, 98, E33.065, E33.068, E33.069
See application file for complete search history.

(56) References Cited

U.S. PATENT DOCUMENTS

| | | | |
|---|---|---|---|
| 3,764,862 A | 10/1973 | Jankowski | |
| 5,905,275 A | 5/1999 | Nunoue et al. | |
| 6,201,265 B1 | 3/2001 | Teraguchi | |
| 8,253,152 B2 * | 8/2012 | Lee | 257/98 |
| 2002/0017653 A1 | 2/2002 | Chuang | |
| 2002/0074556 A1 | 6/2002 | Kwak et al. | |
| 2004/0119084 A1 * | 6/2004 | Hsieh et al. | 257/98 |
| 2007/0018184 A1 | 1/2007 | Beeson et al. | |
| 2007/0295952 A1 * | 12/2007 | Jang et al. | 257/15 |

FOREIGN PATENT DOCUMENTS

| | | |
|---|---|---|
| JP | 2004-207508 A | 7/2004 |
| KR | 10-2001-0042718 A | 5/2001 |

* cited by examiner

*Primary Examiner* — Robert Huber
(74) *Attorney, Agent, or Firm* — Birch, Stewart, Kolasch & Birch, LLP

(57) ABSTRACT

A semiconductor light emitting device that includes: a light emitting structure; an electrode layer under the light emitting structure; a light transmitting layer under of the light emitting structure; a reflective electrode layer connected to the electrode layer; and a conductive supporting member under the reflective electrode layer and electrically connected to the reflective electrode layer. The reflective electrode layer includes a first part in contact with an under surface of the electrode layer and a second part spaced apart from the electrode layer. A portion of the light transmitting layer is physically contacted with an outer side of the electrode layer and is physically contacted with the lower surface of the light emitting structure. The conductive supporting member has a thickness thicker than a thickness of the light transmitting layer.

18 Claims, 7 Drawing Sheets

SEMICONDUCTOR LIGHT EMITTING DEVICE INCLUDING A VERTICALLY ARRANGED LIGHT TRANSMITTING LAYER AND LIGHT EMITTING STRUCTURE

CROSS-REFERENCE TO RELATED APPLICATIONS

The present application is a continuation of application Ser. No. 12/275,072 now U.S. Pat. No. 8,253,152, filed Nov. 20, 2008, which claims priority under 35 U.S.C. 119 to Korean Patent Application No. 10-2007-0119967 (filed on Nov. 23, 2007), which is hereby incorporated by reference in its entirety.

BACKGROUND

The present disclosure relates to a semiconductor light emitting device.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

Embodiments provide a semiconductor light emitting device comprising a structure capable of adjusting an orientation angle of light under a light emitting structure.

Embodiments provide a semiconductor light emitting device comprising a reflective electrode layer capable of reflecting light under a light emitting structure toward an upper direction and a lateral direction.

Embodiments provide a semiconductor light emitting device capable of improving a light orientation characteristic and an emission amount in a lateral direction.

An embodiment provides a semiconductor light emitting device comprising: a light emitting structure including a first conductive semiconductor layer, a second conductive semiconductor layer under the first conductive semiconductor layer, and an active layer between the first conductive semiconductor layer and the second conductive semiconductor layer; an electrode layer under the light emitting structure; a light transmitting layer under a lower surface of the light emitting structure; a reflective electrode layer electrically connected to the electrode layer; and a conductive supporting member under the reflective electrode layer and electrically connected to the reflective electrode layer, wherein the reflective electrode layer includes a first part in contact with a lower surface of the electrode layer and a second part in contact with a lower surface of the light transmitting layer, wherein a portion of the light transmitting layer is physically contacted with an outer side of the electrode layer and is physically contacted with the lower surface of the light emitting structure, wherein the conductive supporting member has a thickness thicker than a thickness of the light transmitting layer.

An embodiment provides a semiconductor light emitting device comprising: a light emitting structure including a first conductive semiconductor layer, a second conductive semiconductor layer under the first conductive semiconductor layer, and an active layer between the first conductive semiconductor layer and the second conductive semiconductor layer; an electrode layer under a first region of a lower surface of the light emitting structure; an electrode on a top surface of the light emitting structure; a light transmitting layer under a second region of the lower surface of the light emitting structure; a reflective electrode layer under the electrode layer; and a conductive supporting member under the reflective electrode layer and electrically connected to the reflective electrode layer, wherein the lower surface of the light emitting structure is formed in a flat surface, wherein the reflective electrode layer includes a first part in contact with a lower surface of the electrode layer and a second part in contact with the lower surface of the light transmitting layer, wherein a portion of the light transmitting layer is physically contacted with an outer side of the electrode layer and is physically contacted with the second region of the lower surface of the light emitting structure, wherein the conductive supporting member has a thickness thicker than a thickness of the light transmitting layer.

An embodiment provides a method of fabricating a semiconductor light emitting device comprising: forming a light emitting structure on a substrate, the light emitting structure comprising a first conductive semiconductor layer, an active layer, and a second conductive semiconductor layer: forming a light transmitting layer at outer side on the light emitting structure; forming a reflective electrode layer on the light transmitting layer, the reflective electrode layer being electrically connected to the inner side of the light emitting structure; forming a conductive supporting member on the reflective electrode layer; removing the substrate; and forming a first electrode on the first conductive semiconductor layer.

The details of one or more embodiments are set forth in the accompanying drawings and the description below. Other features will be apparent from the description and drawings, and from the claims.

DETAILED DESCRIPTION OF THE EMBODIMENTS

Figure 1:
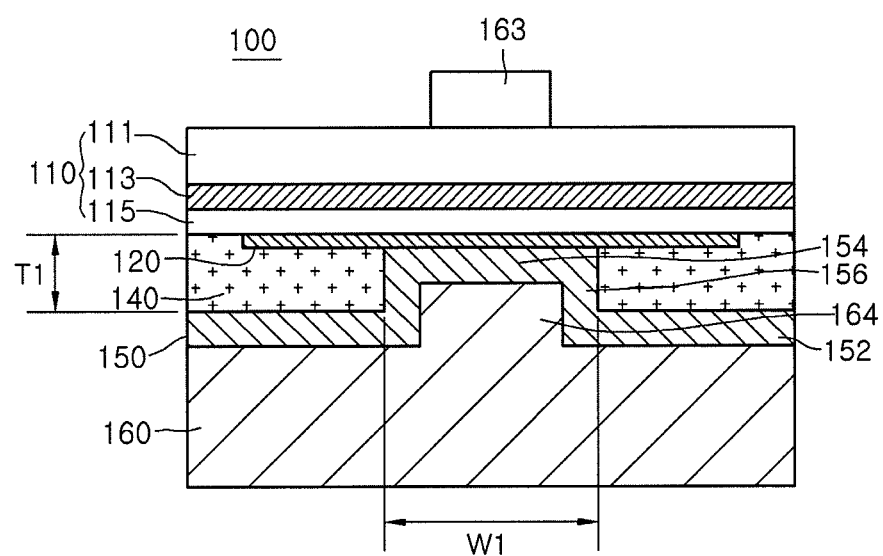
FIG. 1 is a cross-sectional view of a semiconductor light emitting device according to a first embodiment.

Hereinafter, a semiconductor light emitting device according to embodiments will be described with reference to the accompanying drawings. During the following description, the definition of being 'on' or 'under' will be illustrated based on each drawing. Moreover, the thickness of each layer is just one example and also is not limited to the drawing.

FIG. 1 is a cross-sectional view of a semiconductor light emitting device according to a first embodiment.

Referring to FIG. 1, a semiconductor light emitting device 100 comprises a light emitting structure 110, a transparent electrode layer 120, a light transmitting layer 140, a reflective electrode layer 150, and a conductive supporting member 160.

The light emitting structure 110 comprises a first conductive semiconductor layer 111, an active layer 113, and a second conductive semiconductor layer 115. A first electrode 163 of a predetermined pattern is formed on the first conductive semiconductor layer 111 and the active layer 113 is formed under the first conductive semiconductor layer 111. The second conductive semiconductor layer 115 is formed under the active layer 113.

The first conductive semiconductor layer 111 may be realized with a semiconductor layer doped with a first conductive dopant. If the first conductive semiconductor layer 111 is an N-type semiconductor layer, it may be formed of one of chemical semiconductors such as GaN, InN, AlN, InGaN, AlGaN, and InAlGaN, AlInN. The first conductive dopant selectively comprises one of Si, Ge, Sn, Se, and Te as the N-type dopant.

The active layer 113 may have a single quantum well or a multi quantum well structure and may be formed with an InGaN/GaN or AlGaN/GaN structure. The active layer 113 may be selectively formed of a light emitting material of a predetermined wavelength. For example, if the predetermined wavelength is a blue color emission of 460 nm to 470 nm, a single or multi quantum well structure may be formed periodically (one period comprising an InGaN well layer/GaN barrier layer). The active layer 113 may comprise a material for emitting a colored light such as blue wavelength light, red wavelength light, and green wavelength light.

A conductive clad layer (not shown) may be formed on or/and under the active layer 113.

The second conductive semiconductor layer 115 may be realized with a semiconductor layer doped with a second conductive dopant. If the second conductive semiconductor layer 115 is a P-type semiconductor layer, it may be formed of one of chemical semiconductors such as GaN, InN, AlN, InGaN, AlGaN, InAlGaN, and AlInN. The second conductive dopant selectively comprises one of Mg, Zn, Ca, Sr, and Ba as the P-type dopant.

Moreover, a third conductive semiconductor layer (not shown) may be formed under the second conductive semiconductor layer 115. The third conductive semiconductor layer may be realized with an N-type semiconductor layer if the first conductive semiconductor layer 111 is an N-type semiconductor layer. If the first conductive semiconductor layer 111 is a P-type semiconductor layer, the second conductive semiconductor layer 115 may be realized with an N-type semiconductor layer. The light emitting structure 110 may be one of an N-P junction structure, a P-N junction structure, an N-P-N junction structure, and a P-N-P junction structure.

The transparent electrode layer 120 is formed under the second conductive semiconductor layer 115 of the light emitting structure 110. The transparent electrode layer 120 is formed of at least one as a transparent conductive material of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), ZnO, RuOx, TiOx, and IrOx.

The transparent electrode layer 120 may be formed of a single layer or with a predetermined pattern. The transparent electrode layer 120 may have a predetermined pattern (e.g., a matrix pattern) and this predetermined pattern may vary within the technical scope of an embodiment. If the transparent electrode layer 120 may not be formed, the reflective electrode layer 150 serves to perform functions of the transparent electrode layer 120.

The outer end of the transparent electrode layer 120 may not be exposed to the outer of the semiconductor light emitting device 100. That is, by not exposing the outer of the transparent electrode layer 120, its material is prevented from affecting the outer of the light emitting structure 110.

The light transmitting layer 140 is formed under the outer of the transparent electrode layer 120 and the reflective electrode layer 150 is formed under the inner of the transparent electrode layer 120.

The light transmitting layer 140 may have a predetermined thickness along the outer circumference of the transparent electrode layer 120. The outer of the light transmitting layer 140 contacts the under surface of the second conductive semiconductor layer 115 and the outer of the transparent electrode layer 120 is not exposed to the outside of the light transmitting layer 140.

The light transmitting layer 140 may be formed of at least one of materials having low reflective characteristic and high transmittivity such as $SiO_2$, $Si_3N_4$, $TiO_2$, NiO, $Al_2O_3$, and polymer series. The thickness T1 of the light transmitting layer 140 may range from 3 μm to 20 μm.

The reflective electrode layer 150 is formed under the transparent electrode layer 120 and the light transmitting layer 140. The reflective electrode layer 150 is formed of at least one of materials having high reflective characteristic such as Al, Al-series alloy, Ag, Ag-series alloy, Pd, Pd-series alloy, Rh, Rh-series alloy, Pt, and Pt-series alloy.

The reflective electrode layer 150 comprises a side part 152, a center part 154, and a middle part 156. The side part 152 is formed under the light transmitting layer 140. The center part 154 is formed under the transparent electrode layer 120 to serve as a second electrode. The middle part 156 is connected between the side part 152 and the center part 154 and there is a height difference between the side part 152 and the center part 154 along the inner circumference of the light transmitting layer 140.

The middle part 156 of the reflective electrode layer 150 corresponds to the thickness of the light transmitting layer 140 and may be formed almost perpendicular to the extension line of the side part 152.

The side part 152 and the center part 154 of the reflective electrode layer 150 are parallel to the extension line of the light emitting structure 110, and the middle part 156 is formed almost perpendicular to the extension line of the light emitting structure 110.

Since a portion of the reflective electrode layer 150 is not parallel to the light emitting structure 110, a light progressing into the reflective electrode layer 150 may be reflected toward respectively different lateral directions. That is, the side part 152, the center part 154, and the middle part 156 of the reflective electrode layer 150 reflect the incident light in respectively different lateral directions.

The center part 154 of the reflective electrode layer 150 may connect, by a predetermined width W1, the inner portion of the transparent electrode layer 120, and its connection area is 10% to 70% of the under surface area of the transparent electrode layer 120. The upper surface of the light transmitting layer 140 contacts the outer portion of the transparent electrode layer 120, and its contact area is 30% to 90% of the under surface area of the transparent electrode layer 120. Here, according to the connection areas of the transparent electrode layer 120, the reflective electrode layer 150, and the light transmitting layer 140, an orientation angle of light may vary. Additionally, according to the thickness T1 of the light transmitting layer 140, an orientation angle of light can be adjusted.

The conductive supporting member 160 is formed under the reflective electrode layer 150, and serves as the second electrode in company with the reflective electrode layer 150. The conductive supporting member 160 may be formed of copper, gold, or a carrier wafer (e.g., Si, Ge, GaAs, ZnO, and SiC). For example, the conductive supporting member 160 may be formed by using copper plating or wafer bonding technique, but is not limited thereto.

Once a power is supplied, light is emitted from the active layer 113 of the light emitting structure 110, and the emitted light is radiated in all directions of the light emitting structure 110. The light progressing under the light emitting structure 110 transmits the transparent electrode layer 120 and the light transmitting layer 140. At this point, the center part 154 of the reflective electrode layer 150 reflects the light transmitted through transparent electrode layer 120, and the side part 152 and the middle part 156 reflect the light transmitted through the light transmitting layer 140.

The middle part 156 of the reflective electrode layer 150 is formed almost perpendicular to the extension line of the light emitting structure 110 and thus reflects an incident light in the lateral direction. Additionally, the side part 152 of the reflective electrode layer 150 re-reflects the light reflected from the middle part 156 and at this point, can reflect a portion of the incident light into the lateral direction. The reflective electrode layer 150 can improves light orientation characteristic and a radiation amount in the lateral direction with respect to the semiconductor light emitting device 100.

FIGS. 2 to 8 are views illustrating manufacturing processes of a semiconductor light emitting device according to a first embodiment.

Figure 2:
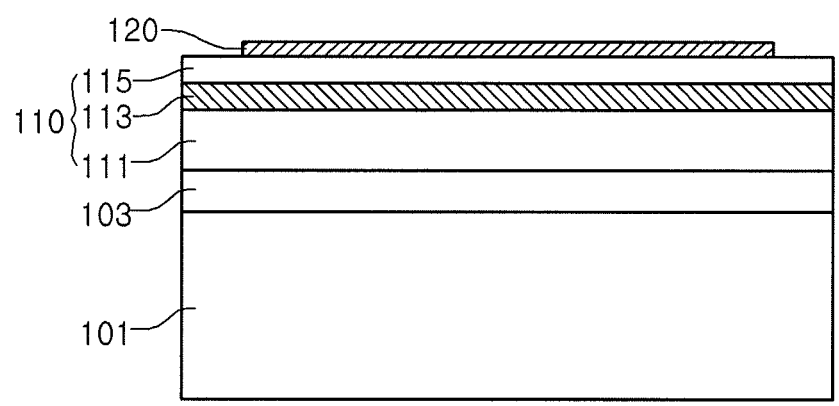
FIGS. 2 to 8 are views illustrating manufacturing processes of a semiconductor light emitting device according to a first embodiment.

Referring to FIG. 2, a buffer layer 103 is formed on a substrate 101. The substrate 101 is formed of one selected from $Al_2O_3$, GaN, SiC, ZnO, Si, GaP, InP, and GaAs. The buffer layer 103 may be formed of one of chemical compounds of III-V groups such as GaN, InN, AlN, InGaN, AlGaN, and InAlGaN, and also may be doped with a conductive dopant.

An undoped semiconductor layer (not shown) may be formed on the buffer layer 103. At least one of the buffer layer and the undoped semiconductor layer may be formed or none of them may be formed. Or, they may be removed from the final structure. There is no limitation about a semiconductor growing on the substrate 101.

The light emitting structure 110 may be formed on the buffer layer 103. The light emitting structure 110 comprises a first conductive semiconductor layer 111, an active layer 113, and a second conductive semiconductor layer 115. In the light emitting structure 110, the first conductive semiconductor layer 111 is formed on the buffer layer 103, the active layer 113 is formed on the first conductive semiconductor layer 111, and the second conductive semiconductor layer 115 is formed on the active layer 113. A conductive clad layer may be formed on or/and under the active layer 113. The light emitting structure 110 may be added or modified within the technical scope of an embodiment and is not limited to the stacked layer structure.

The first conductive semiconductor layer 111 may be realized with a semiconductor layer doped with a first conductive dopant. If the first conductive semiconductor layer 111 is an N-type semiconductor layer, it may be formed of one of chemical semiconductors such as GaN, InN, AlN, InGaN, AlGaN, and InAlGaN, AlInN. The first conductive dopant selectively comprises one of Si, Ge, Sn, Se, and Te as the N-type dopant.

The active layer 113 may have a single quantum well or a multi quantum well structure and may be formed with an InGaN/GaN or AlGaN/GaN structure. The active layer 113 may be selectively formed of a light emitting material of a predetermined wavelength. For example, if the predetermined wavelength is a blue color emission of 460 nm to 470 nm, a single or multi quantum well structure may be formed periodically (one period comprising an InGaN well layer/GaN barrier layer). The active layer 113 may comprise a material for emitting a colored light such as blue wavelength light, red wavelength light, and green wavelength light.

The second conductive semiconductor layer 115 may be realized with a semiconductor layer doped with a second conductive dopant. If the second conductive semiconductor layer 115 is a P-type semiconductor layer, it may be formed of one of chemical semiconductors such as GaN, InN, AlN, InGaN, AlGaN, InAlGaN, and AlInN. The second conductive dopant selectively comprises one of Mg, Zn, Ca, Sr, and Ba as the P-type dopant.

The transparent electrode layer 120 is formed on the second conductive semiconductor layer 115 of the light emitting structure 110. The transparent electrode layer 120 is formed of at least one of ITO, IZO, IZTO, IAZO, IGZO, IGTO, AZO, ATO, ZnO, RuOx, TiOx, and IrOx.

The transparent electrode layer 120 is formed within an area of the second conductive semiconductor layer 115 and may not be exposed to the outside of the second conductive semiconductor layer 115.

Figure 3:
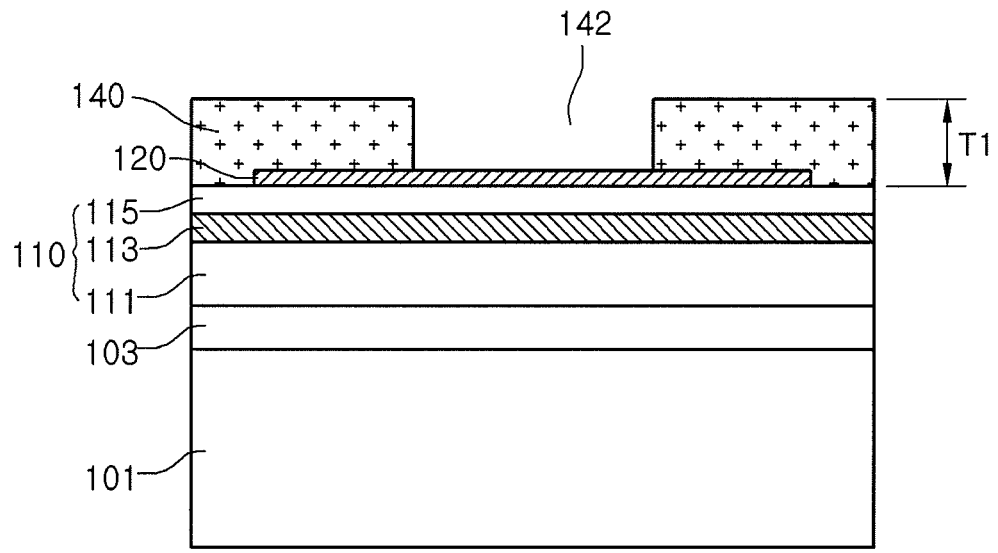

Referring to FIG. 3, the center area 142 of the transparent electrode layer 120 is masked by a mask pattern (not shown) and the light transmitting layer 140 is formed on the side areas of the transparent electrode layer 120.

The light transmitting layer 140 may be formed of at least one of materials having low reflective characteristic and high transmittivity such as $SiO_2$, $Si_3N_4$, $TiO_2$, NiO, $Al_2O_3$, and polymer series. The thickness T1 of the light transmitting layer 140 may range from 3 μm to 20 μm.

The outer portion of the light transmitting layer 140 may contact the second conductive semiconductor layer 115.

Figure 4:
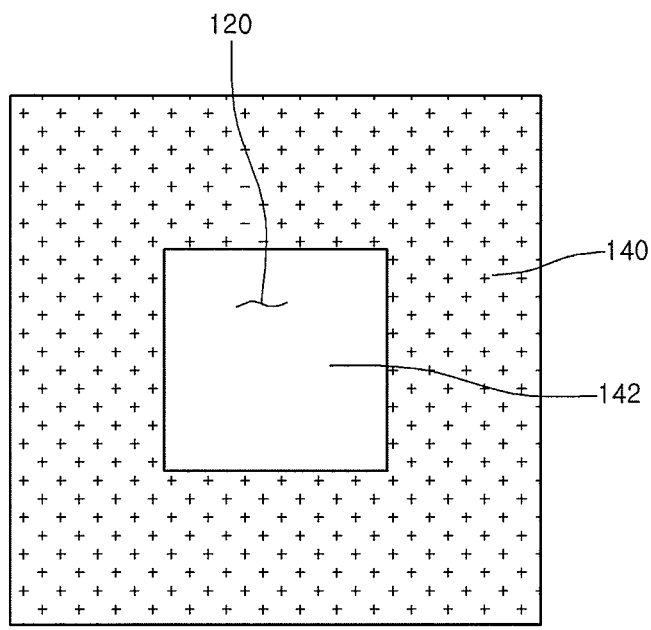

FIG. 4 is a plan view of the light transmitting layer and the transparent electrode layer of FIG. 3.

Referring to FIG. 4, the light transmitting layer 140 is formed around the center area 142 of the transparent electrode layer 120, and the center area 142 of the transparent electrode layer 120 may have a rectangular form or other forms such as a polygonal form, a circle form, and an ellipse form.

Figure 5:
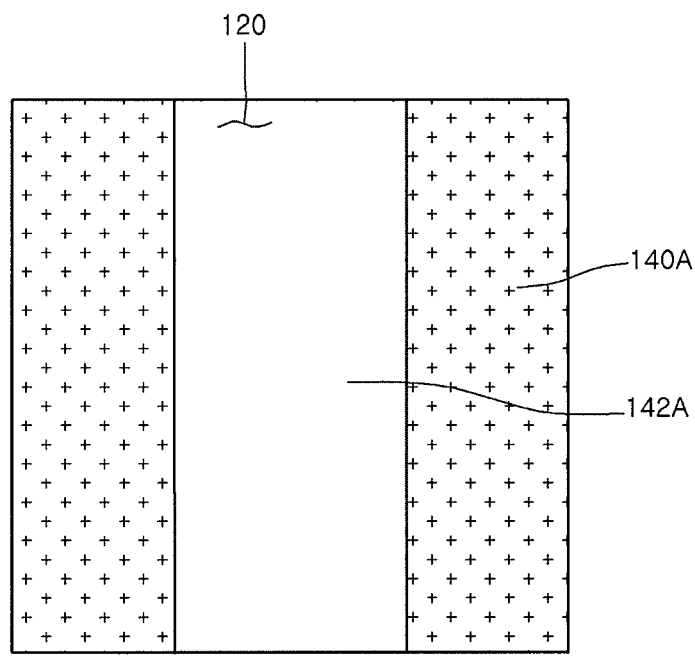

FIG. 5 is a plan view of the light transmitting layer of FIG. 3 according to another embodiment.

Referring to FIG. 5, the light transmitting layer 140A is formed on the left/right areas of the transparent electrode layer 120, and is not formed on the front/rear areas of the transparent electrode layer 120. Accordingly, the center area 142A of the transparent electrode layer 120 is formed to have the opened front/rear. A pattern for the center area 142A of the transparent electrode layer 120 may be formed with a cross within the technical scope of an embodiment and is not limited thereto.

Figure 6:
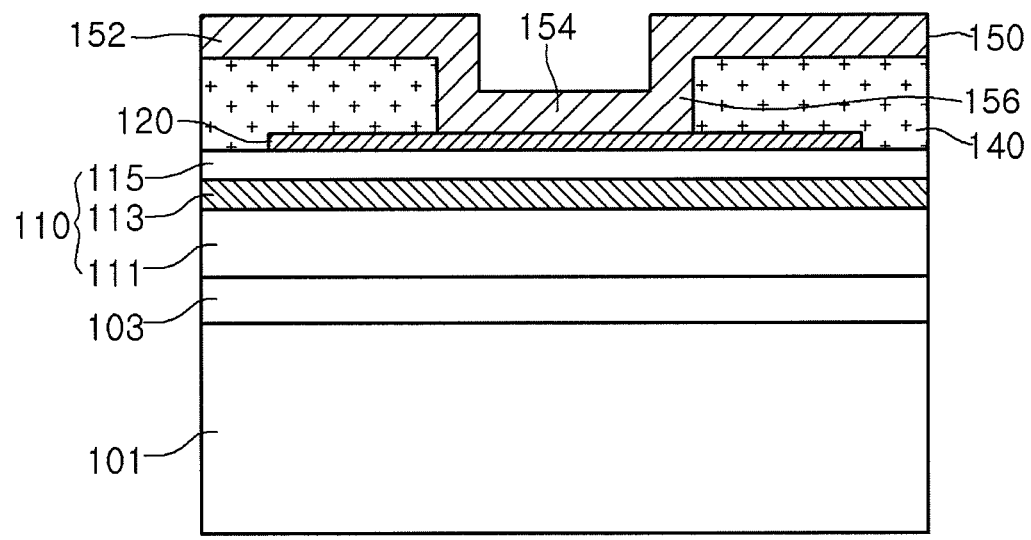

Referring to FIG. 6, a reflective electrode layer 150 is formed on the light transmitting layer 140 and the transparent electrode layer 120. The reflective electrode layer 150 serves as a second electrode and performs a reflecting function. The reflective electrode layer 150 may be formed of at least one of Al, Al-series alloy, Ag, Ag-series alloy, Pd, Pd-series alloy, Rh, Rh-series alloy, Pt, and Pt-series alloy.

The side part 152 of the reflective electrode layer 150 is formed on the light transmitting layer 140. The center part 154 is formed on the transparent electrode layer 120. The middle part 156 is formed on the inner circumference of the light transmitting layer 140.

The middle part 156 of the reflective electrode layer 150 is connected between the side part 152 and the center part 154, and there is a height difference between the side part 152 and the center part 154 along the inner circumference of the light transmitting layer 140. The middle part 156 of the reflective electrode layer 150 corresponds to the thickness of the light transmitting layer 140, and may be formed almost perpendicular on the extension line of the side part 152.

The side part 152 and the center part 154 of the reflective electrode layer 150 are formed parallel to the light emitting structure 110, and the middle part 156 is formed almost perpendicular to the extension line parallel to the light emitting structure 110.

Since a portion of the reflective electrode layer 150 is not parallel to the light emitting structure 110, the light progressing into the reflective electrode layer 150 may be reflected toward respectively different lateral directions. That is, the side part 152, the center part 154, and the middle part 156 of the reflective electrode layer 150 reflect an incident light toward respectively different lateral directions.

The reflective electrode layer 150 may connect the upper surface of the transparent electrode layer 120 by 10% to 70%. The light transmitting layer 140 may contact the upper surface of the transparent electrode layer 120 by 30% to 90%.

Here, an orientation angel of light may vary according to connection areas of the transparent electrode layer 120, the reflective electrode layer 150, and the light transmitting light 140. Additionally, an orientation angle of light may be adjusted according to the thickness T1 of the light transmitting layer 140 in FIG. 3.

A conductive supporting member 160 is formed on the reflective electrode layer 150 and serves as a second electrode. The conductive supporting member 160 may be formed of copper, gold, or a carrier wafer (e.g., Si, Ge, GaAs, ZnO, and SiC). For example, the conductive supporting member 160 may be formed by using copper plating or wafer bonding technique, but is not limited thereto.

Figure 7:
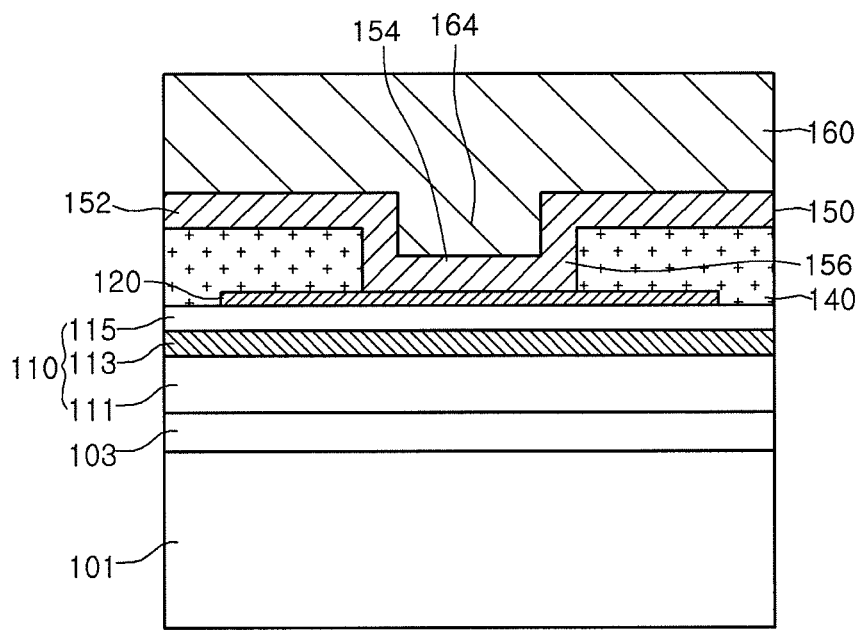
Figure 8:
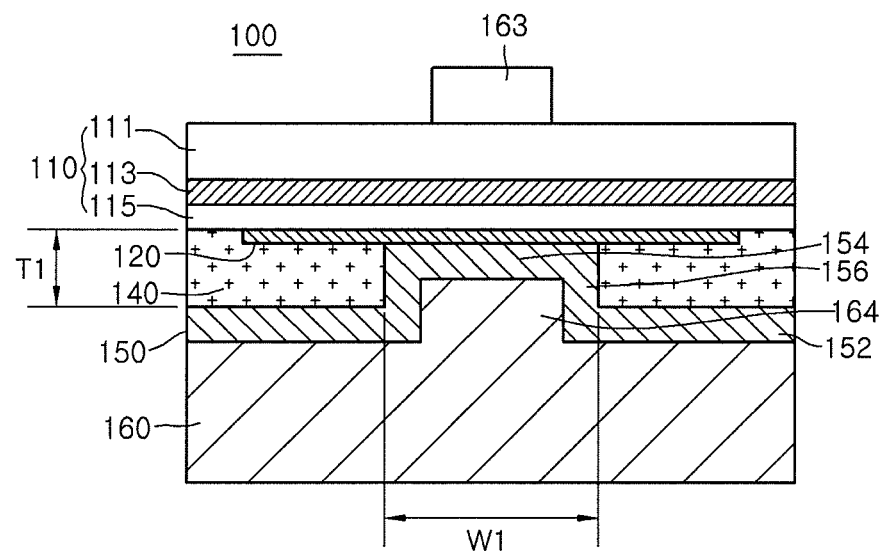

Referring to FIGS. 7 and 8, when the conductive supporting member 160 is formed, the substrate 101 is removed and the buffer layer 103 is removed through an etching method. The substrate 101 and the buffer layer 103 may be removed through physical and/or chemical methods, but is not limited thereto.

After positioning the conductive supporting member 160 down, a first electrode 163 of a predetermined pattern is formed on the first conductive semiconductor layer 111. Consequently, a vertical semiconductor light emitting device is completed.

Once a forward power is supplied, light is generated from the active layer 113 of the light emitting structure 110, and the generated light is emitted toward all directions of the light emitting structure 110. The light progressing under the light emitting structure 110 is transmitted through the transparent electrode layer 120 and the light transmitting layer 140 for progression. At this point, the center part 154 of the reflective electrode layer 150 reflects the light transmitted through the transparent electrode layer 120, and the side part 152 and the middle part 156 reflect the light transmitted through the light transmitting layer 140.

The middle part 156 of the reflective electrode layer 150 is formed almost perpendicular to the extension line of the light emitting structure 110 and thus reflects an incident light in the lateral direction. Additionally, the side part 152 of the reflective electrode layer 150 re-reflects the light reflected from the middle part 156 and at this point, can reflect a portion of the incident light into the lateral direction. The reflective electrode layer 150 can improves light orientation characteristic and a radiation amount in the lateral direction with respect to the semiconductor light emitting device 100.

Figure 9:
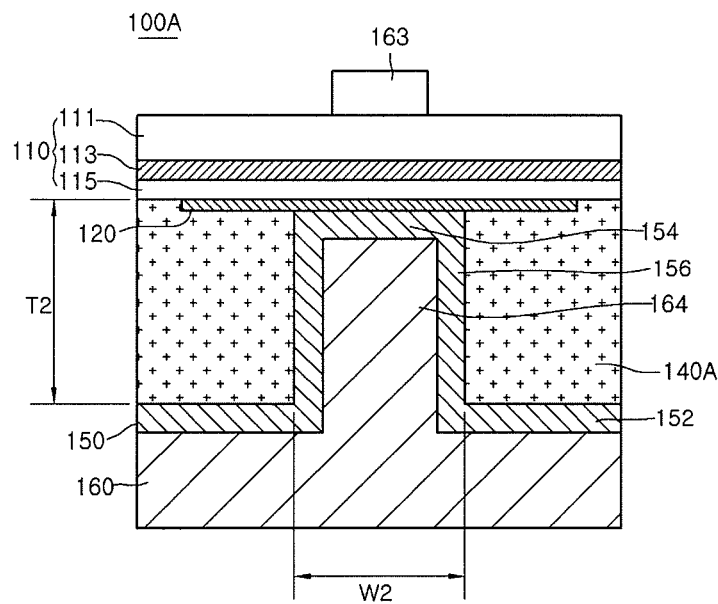
FIG. 9 is a view of a semiconductor light emitting device according to a second embodiment.

FIG. 9 is a view of a semiconductor light emitting device according to a second embodiment. During the description of the second embodiment, a portion identical to the first embodiment will refer to the first embodiment, and thus its overlapping description will be omitted.

Referring to FIG. 9, according to a semiconductor light emitting device 100A, the thickness T2 of the light transmitting layer 140A may be thicker than the thickness T1 of FIG. 1. The thickness T2 of the light transmitting layer 140A may range from 20 μm to 40 μm.

If the thickness T2 of the light transmitting layer 140A becomes thicker, the height of the middle part 152 of the reflective electrode layer 150 is increased. Accordingly, the semiconductor light emitting device 100A can adjust an angle and distribution of light emitted toward the lateral direction by the reflective electrode layer 150. Additionally, the semiconductor light emitting device 100A can improve color mixture when a light unit of a side view type is applied.

Figure 10:
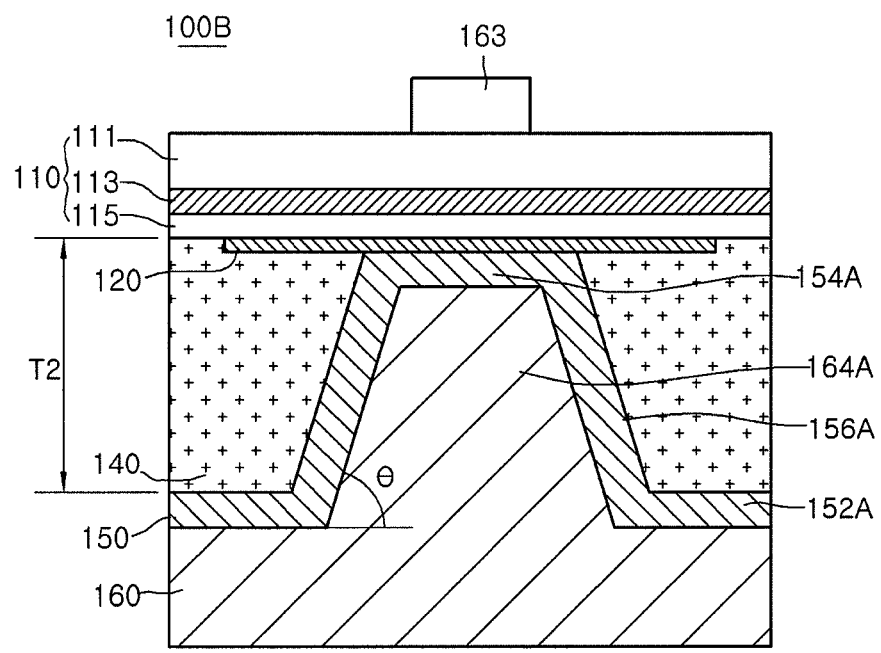
FIG. 10 is a cross-sectional view of a semiconductor light emitting device according to a third embodiment.

FIG. 10 is a cross-sectional view of a semiconductor light emitting device according to a third embodiment. During description of the third embodiment, a portion identical to the first embodiment will refer to the first embodiment, and thus its overlapping description will be omitted.

Referring to FIG. 10, the semiconductor light emitting device 100B has a slanting middle part 156A of a reflective electrode layer 150. The slanting middle part 156A of the reflective electrode layer 150 may vary according to the inner side and inner circumference of the light transmitting layer 140.

The middle part 156A of the reflective electrode layer 150 may have an inclined angle $\theta$ of $30° \leq \theta < 90°$ with respect to the extension line of the side part 152A.

The middle part 156A of the reflective electrode layer 150 has a height having a predetermined angle. The middle part 156A is slanted with respect to the extension line of the light emitting structure 110 and the light transmitted through the light transmitting layer 140 is emitted toward the lateral direction.

The semiconductor light emitting device 100B increases the intensity of light emitted toward the lateral direction and broadens an orientation angel of light emitted toward the lateral direction.

Additionally, according to this embodiment, the structure of the reflective electrode layer 150 is divided into the side part 152A, the center part 154A, and the middle part 156A. However, the middle part 156A may extend to the outer and then can be divided into two or four through a height difference at the middle of the middle part 156A. The structure of the reflective electrode layer 150 may be modified within the technical scope of an embodiment.

Although the embodiment has been made in relation to the compound semiconductor light emitting device comprising the N-P junction structure as an example, the compound semiconductor light emitting device comprising an N-P-N structure, a P-N structure or a P-N-P structure can be implemented. In the description of the embodiment, it will be understood that, when a layer (or film), a region, a pattern, or a structure is referred to as being "on (above/over/upper)" or "under (below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads or patterns, it can be the only layer between the two layers (or films), regions, pads, or patterns or one or more intervening layers may also be present. Thus, it should be determined by technical idea of the invention.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or alignments of the subject combination alignment within the scope of the disclosure, the drawings and the appended claims. In addition to variations and modifications in the component parts and/or alignments, alternative uses will also be apparent to those skilled in the art.

What is claimed is:

1. A semiconductor light emitting device, comprising:
a light emitting structure including a first conductive semiconductor layer, a second conductive semiconductor layer under the first conductive semiconductor layer, and an active layer between the first conductive semiconductor layer and the second conductive semiconductor layer;
a first electrode on a top surface of the light emitting structure;
a second electrode having a plurality of layers under a lower surface of the light emitting structure;
a light transmitting layer under the lower surface of the light emitting structure, wherein all of a top surface of the light transmitting layer is located below all of the lower surface of the light emitting structure; and
a conductive supporting member under a lower surface of the second electrode and electrically connected to the second electrode,
wherein the second electrode includes a first part in contact with the lower surface of the light emitting structure, a second part in contact with a lower surface of the light transmitting layer, and a third part connected between the first and second parts,
wherein a portion of the light transmitting layer is physically contacted with the second electrode and is physically contacted with the lower surface of the light emitting structure,
wherein the third part of the second electrode is sloped with respect to a perpendicular direction of the lower surface of the light emitting structure,
wherein an inner lateral surface of the light transmitting layer is sloped with respect to the lower surface of the light emitting structure and is physically contacted with the third part of the second electrode,
wherein the conductive supporting member is disposed under the first to third parts of the second electrode,
wherein a protrusion of the conductive supporting member is protruded in a direction toward the first part of the second electrode from a region of a top surface of the conductive support member,
wherein an outer lateral surface of the protrusion of the conductive supporting member is sloped with respect to the lower surface of the light emitting structure and is physically contacted with the third part of the second electrode,
wherein the outer lateral surface of the protrusion includes an inclined surface with respect to a horizontal top surface of the protrusion,
wherein the top surface of the protrusion has a horizontal width smaller than a horizontal width of a lower portion of the protrusion adjacent to the third part of the second electrode,
wherein the lower portion of the protrusion has the horizontal width smaller than that of the conductive supporting member,
wherein the light transmitting layer includes a first portion adjacent to the first part of the second electrode and a second portion between a top surface of the second part of the second electrode and an outer portion of the lower surface of light emitting structure,
wherein the protrusion of the conductive support member has a height greater than a height of the second electrode,
wherein the height of the protrusion of the conductive support member is less than a height of the second portion of the light transmitting layer,
wherein the height of the protrusion is equal to or more than an interval between a lower surface of the second part of the second electrode and the top surface of the protrusion, and
wherein the height of the protrusion is greater than a width of a bottom portion of the protrusion.

2. The semiconductor light emitting device according to claim 1,
wherein the second portion of the light transmitting layer is contacted with an outer portion of the lower surface of the light emitting structure and the second part of the second electrode, and
wherein the second part of the second electrode physically contacts a lower surface of the second portion of the light transmitting layer and the top surface of the conductive support member and is vertically overlapped with the lower surface of the light emitting structure.

3. The semiconductor light emitting device according to claim 1, wherein the light transmitting layer is formed of at least one selected from the group consisting of $SiO_2$, $Si_3N_4$, $TiO_2$, NiO, $Al_2O_3$, and a polymer series.

4. The semiconductor light emitting device according to claim 1, wherein the second electrode is formed of at least one of Al, an Al-series alloy, Ag, an Ag-series alloy, Pd, a Pd-series alloy, Rh, an Rh-series alloy, Pt, and a Pt-series alloy.

5. A semiconductor light emitting device, comprising:
a light emitting structure including a first conductive semiconductor layer, a second conductive semiconductor layer under the first conductive semiconductor layer, and an active layer between the first conductive semiconductor layer and the second conductive semiconductor layer;
a first electrode on a top surface of the light emitting structure;
a light transmitting layer in contact with a second region of a lower surface of the light emitting structure;
a second electrode in contact with a first region of the lower surface of the light emitting structure; and
a conductive supporting member under a lower surface of the second electrode and a lower surface of the light transmitting layer,
wherein all of the lower surface of the light emitting structure is formed in a flat surface, wherein the second electrode includes a first part in contact with the lower surface of the light emitting structure, a second part in contact with the lower surface of the light transmitting layer, and a third part connected between the first part and the second part, wherein a portion of the light transmitting layer is physically contacted with the second region of the lower surface of the light emitting structure, wherein all of a top surface of the light transmitting layer is located below all of the lower surface of the light emitting structure, wherein an inner lateral surface of the light transmitting layer is physically contacted with the third part of the second electrode, wherein a protrusion is protruded from a region of a top surface of the conductive supporting member in a direction toward the first part of the second electrode and is formed of the same material as the conductive support member, wherein an outer lateral surface of the protrusion of the conductive supporting member is physically contacted with the third part of the second electrode, wherein the light transmitting layer includes an upper portion corresponding to the lower surface of the light emitting structure and a lower portion contacted with the second part of the second electrode, wherein the light transmitting layer includes a first portion adjacent to the first part of the second electrode and a second portion between a top surface of the second part of the second electrode and an outer portion of the lower surface of light emitting structure, wherein the protrusion of the conductive support member has a height greater than a height of the second electrode, wherein the height of the protrusion of the conductive support member is less than a height of the second portion of the light transmitting layer, wherein the height of the protrusion is an interval between a horizontally extended line of a lower surface of the second part of the second electrode and the top surface of the protrusion, wherein the second part of the second electrode physically contacts a lower surface of the second portion of the light transmitting layer and the top surface of the conductive support member and is vertically overlapped with the lower surface of the light emitting structure, wherein the light transmitting layer has a thickness greater than a thickness of the light emitting structure, and wherein a side surface of the first conductive semiconductor layer does not contact the light transmitting layer.

6. The semiconductor light emitting device according to claim 5, wherein the lower portion of the light transmitting layer is directly contacted with the top surface of the second part of the second electrode.

7. The semiconductor light emitting device according to claim 5, wherein the conductive supporting member includes copper or gold.

8. The semiconductor light emitting device according to claim 5, wherein the light transmitting layer is formed of at least one selected from the group consisting of $SiO_2$, $Si_3N_4$, $TiO_2$, NiO, $Al_2O_3$, and a polymer series.

9. The semiconductor light emitting device according to claim 5, wherein an outer sidewall of the conductive supporting member and an outer sidewall of the light transmitting layer are disposed on a common plane.

10. The semiconductor light emitting device according to claim 9, wherein the outer sidewall of the light transmitting layer and an outer sidewall of the second part of the second electrode are disposed on a common plane.

11. The semiconductor light emitting device according to claim 5, wherein the protrusion includes an upper portion adjacent to the first part of the second electrode and a lower portion adjacent to the second part of the second electrode, and wherein a horizontal width of the upper portion of the protrusion is smaller than that of the lower portion of the protrusion.

12. The semiconductor light emitting device according to claim 5, wherein the conductive supporting member is formed of a metal material, wherein the second electrode has a recess, and wherein the protrusion is disposed in the recess of the second electrode.

13. The semiconductor light emitting device according to claim 1, wherein the conductive supporting member is formed of a metal material.

14. The semiconductor light emitting device according to claim 1, wherein the second electrode has a recess, and wherein the protrusion of the conductive supporting member is disposed in the recess of the second electrode.

15. The semiconductor light emitting device according to claim 14, wherein the recess of the second electrode is disposed under the first part and the third part.

16. The semiconductor light emitting device according to claim 1, wherein the third part of the second electrode is sloped with respect to a horizontally extended line of the second part of the second electrode, wherein the first part of the second electrode is formed in the same thickness as the second part of the second electrode, and wherein the third part of the second electrode has a sloped angle of $30°\leq\theta<90°$ with respect to a horizontally extended line of the second part of the second electrode.

17. The semiconductor light emitting device according to claim 1, wherein the first part of the second electrode includes a plurality of layers and at least one of the plurality of layers is a reflective layer.

18. The semiconductor light emitting device according to claim 5, wherein the thickness of the light transmitting layer is in a range of about 20 μm to about 40 μm.

* * * * *